United States Patent [19]

Lenihan

[11] 4,118,700
[45] Oct. 3, 1978

[54] SINGLE WIRE TRANSMISSION OF MULTIPLE SWITCH OPERATIONS

[75] Inventor: Thomas Francis Lenihan, Levittown, Pa.

[73] Assignee: RCA Corporation, New York, N.Y.

[21] Appl. No.: 801,660

[22] Filed: May 31, 1977

[51] Int. Cl.² .......................................... G08B 25/00
[52] U.S. Cl. .................................. 340/524; 340/537; 340/545; 307/100; 307/116
[58] Field of Search ............. 340/52 F, 63, 64, 213 R, 340/213 Q, 276, 409, 412, 415, 420, 416; 307/100, 113, 115, 116, 125

[56] References Cited

U.S. PATENT DOCUMENTS 3,370,181   2/1968   Sitomer ........................... 307/100 X Primary Examiner—Alvin H. Waring
Attorney, Agent, or Firm—H. Christoffersen; Samuel Cohen; Carl M. Wright

[57] ABSTRACT

Each of a plurality of switches is connected in parallel with an impedance and the switches are coupled to form a series circuit. A reference voltage is coupled to one end of the series circuit and a termination impedance is coupled to the other end to form a voltage divider. The voltage divider ratio is determined by the switches that are operated and the divided voltage is coupled to an analog-to-digital converter producing a binary output signal that indicates which combination of switches is operated. Another embodiment of the invention uses a constant current generator instead of a termination impedance to provide linear ratios in the voltage divider.

10 Claims, 6 Drawing Figures

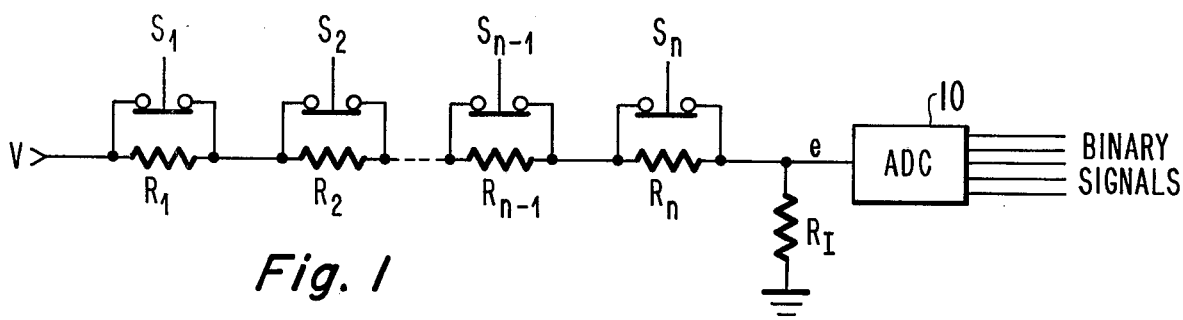
Fig. 1
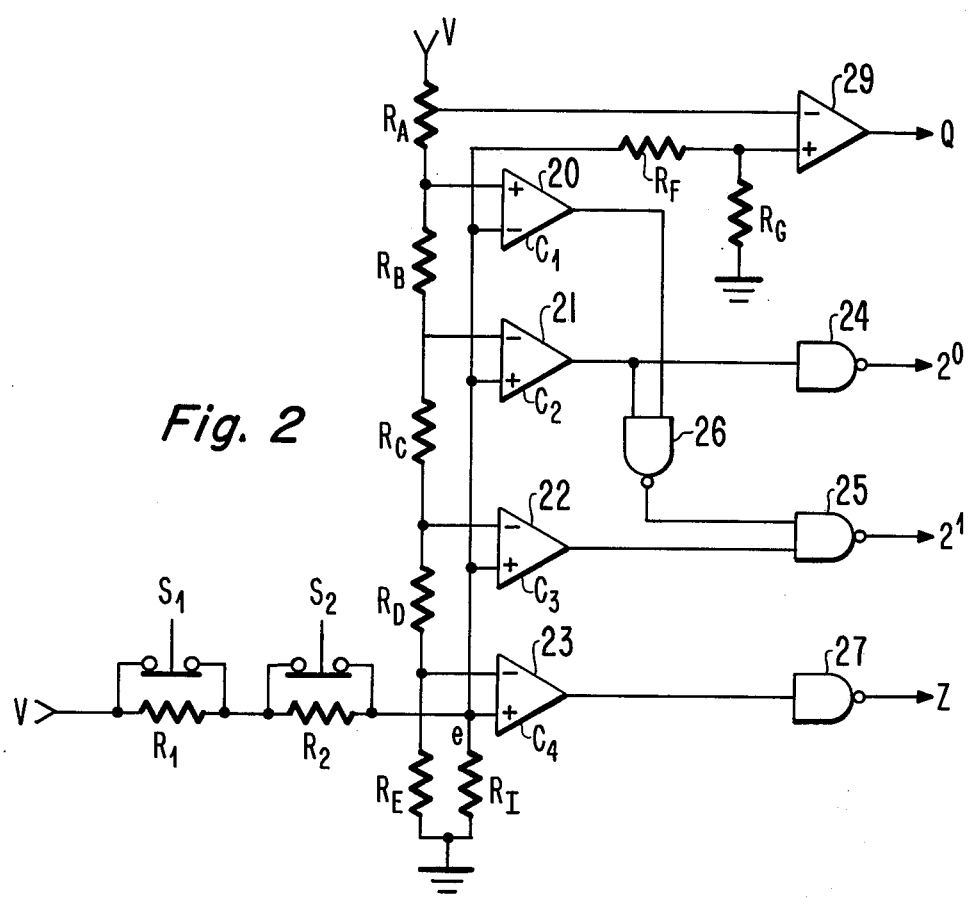
Fig. 2
Fig. 3
| $S_1$ | $S_2$ | $e/V$ | $C_1$ | $C_2$ | $C_3$ | $C_4$ | $2^1$ | $2^0$ |
|---|---|---|---|---|---|---|---|---|
| 0 | 0 | 1.000 | 0 | 1 | 1 | 1 | 0 | 0 |
| 1 | 0 | 0.625 | 1 | 1 | 1 | 1 | 1 | 0 |
| 0 | 1 | 0.375 | 1 | 0 | 1 | 1 | 0 | 1 |
| 1 | 1 | 0.306 | 1 | 0 | 0 | 1 | 1 | 1 |
SWITCH CLOSED = 0; SWITCH OPEN = 1

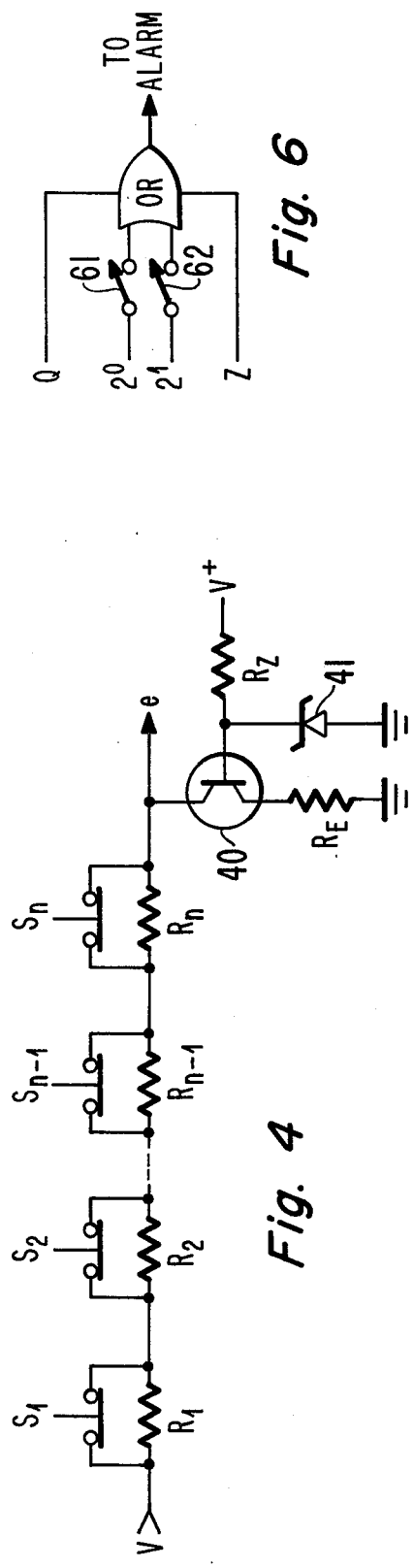
Fig. 4
Fig. 6
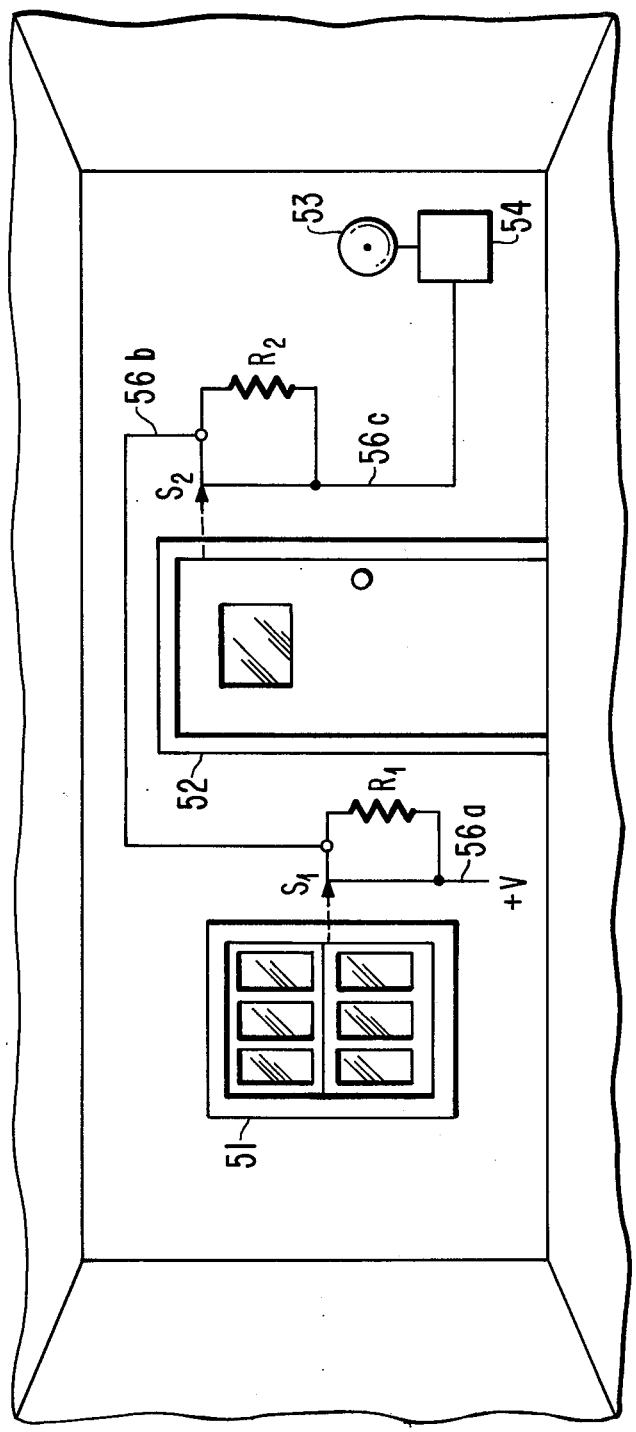
Fig. 5

SINGLE WIRE TRANSMISSION OF MULTIPLE SWITCH OPERATIONS

This invention relates to the transmission of coded signals, particularly to a single wire multiple switching circuit.

It is often desirable, especially where switches are remotely located from a controlled equipment, to connect a plurality of switches with minimum wiring. For example, in a burglar alarm system where a switch is provided at each of several entry locations, e.g., every window and door, the switches are usually coupled in series with the activating device. It is, however, impossible to ascertain in a simple series circuit which switch was opened. In sophisticated systems such as those controlled by microprocessors, it may be desirable to permit the opening of a particular entrance or window without activating the alarm; this requires an indication of the switch thus operated. It is also sometimes desirable to be able to ascertain which of a subset of switches is operated.

There are, therefore, many situations where it is desirable to have a single wire connecting a plurality of switches. There is, however, as a matter of economics, a tradeoff between the advantages of wiring the switches separately compared to the economy of a simple series connection. The invention described and claimed herein provides the advantages of both alternatives.

A circuit embodying the invention includes first and second voltage reference sources and an analog-to-digital converter, the converter having an input or termination impedance with one terminal coupled to the second voltage reference source. Also included is a plurality of impedance means coupled in series between the first reference source and the input to the analog-to-digital converter, each impedance having connected thereacross a selectively operable switch for selectively bypassing the individual impedances.

In the drawings:

FIG. 1 is a schematic of a circuit embodying the invention and having $n$ switches;

FIG. 2 is a schematic of an embodiment of the invention having two switches;

FIG. 3 is a table showing the operation of the circuit of FIG. 2;

FIG. 4 is a schematic of the invention using a constant current source in place of the termination impedance;

FIG. 5 is an illustration of a burglar alarm embodying the invention; and

FIG. 6 is a logic circuit showing how a switch can be selectively removed from the detection circuit.

This invention encompasses the use of a single-wire circuit for coupling a plurality of switches to a utilization device. As shown in FIG. 1, a plurality of resistors R1-R$n$ are coupled in series with a resistor RI. The resistor RI can be the termination impedance of an analog-to-digital converter (ADC) 10, which has its input port coupled to receive the analog voltage at the junction of RI with one terminal of the series circuit R1-R$n$. A voltage source V is coupled to the other end terminal of the series circuit R1-R$n$. In practice, the voltage V can be of the same value as the voltage reference used in the ADC 10.

Analog-to-digital converters are well known in the art. The input voltage is converted into a binary number which most nearly represents the input voltage. That is, for $k$ binary output lines, the ratio of the input voltage $e$, to the reference voltage $Vr$, is approximately equal to the ratio of the output binary value, B, to $2^k$. Symbolically, $$e/Vr \doteq B/2^k.$$

The approximation results from quantization error, which can be reduced by increasing the value of $k$. In the following description, $Vr$ will be considered to be V.

For $n$ switches, there must be $n$ binary output signals in order to indicate the condition of each switch individually. If the circuit is constrained to allow only one switch to be operated at one time, the binary number can indicate the operated switch; in this case, only int$\geq$(log$_2 n$) binary lines are required. (The symbol int$\geq$(log$_2 n$) indicates the integer that is not less than the base-2 logarithm of $n$.)

Where $n$ binary output lines are provided, one corresponding to each of the $n$ switches, the resistor values can be determined by the following relationship:

$$Ri = (2^i - 1)RI \text{ for } i = 1,2,3 \ldots, n.$$

For example, if $n = 4$, then $R1 = RI$, $R2 = 3RI$, $R3 = 7RI$, and $R4 = 15RI$. When none of the switches is operated (that is, all switches are closed), the input voltage, $e$ to the ADC 10 is equal to V, i.e., $e/V = 1$. Operating (opening) only the switch S1 results in $e = V/2$, i.e., $e/V = \frac{1}{2}$. Operating only the switch S2 produces $e = V/4$ or $e/v = \frac{1}{4}$, and so on. When only one switch at a time is opened, that opened switch will cause a binary signal to appear on only one binary output line related to the operated switch.

If only int$\geq$(log$_2 n$) binary output lines are used, the resistor values are $$Ri = iRI \text{ for } i = 1,2,3, \ldots, n.$$

The operation of a switch will produce a combination of binary output signals from the ADC 10 that identify the binary number of the operated switch. That is, $k$ binary output lines can indicate $2^k - 1$ switch conditions; the minus one results from reserving the zero condition to indicate no switch is operated. For example, if $k$ is two, three switches can be monitored; $2^0 = 1$, $2^1 = 0$ shows switch one is operated; $2^0 = 0$, $2^1 = 1$, switch two; and $2^0 = 1$, $2^1 = 1$, switch three.

The switches are shown as normally bypassing or shorting the associated impedance, but the principle of the invention includes the use of normally open switches across each impedance such that operation of a switch bypasses the associated impedance.

The embodiment in which each of the binary output lines represents a particular switch but without the constraint of operating only one switch at a time is a more complex problem.

In general, $n$ switches encompass $2^n$ subsets. Therefore, with two switches, it is necessary to have the digital output of the ADC respond to four distinct levels, each of which corresponds to a unique combination of open and closed switches. With both switches closed, the voltage into the ADC, $e$, is equal to the input voltage, V, i.e., the ratio $e/V = 1$. With switch S1 open, the ratio RI/(RI+R1) equals the ratio $e/V$ and for best results should equal 0.75. If switch S2 is opened, the ratio $e/V$ is equal to the ratio $RI/(RI+R2)$ and for best results should be 0.5. With both switches S1 and S2 open, the $e/V$ ratio is equal to $RI/(R1 + R2 + RI)$ and should be 0.25 for best results.

The ratio of the switch values in the multiple-operated switch circuit can be derived from consideration of the desired ratio of the input voltage, $e$, at the input terminal of the analog-to-digital converter (ADC) 10 to the supply voltage, V. The case of two switches will be described in detail and this will be applied to the general case of $n$ switches.

Two switches can be operated in four different ways. First, neither switch is opened so that $e/V$ is 1 and the two ADC binary output signals will both represent binary zero. These two signals are hereafter termed $2^1$ and $2^0$ so that in this case, $2^1 = 0$ and $2^0 = 0$. If switch S1 is opened, the desired voltage ratio is $\frac{3}{4}$ and the ADC outputs will be $2^1 = 1$ and $2^0 = 0$. For switch S2 open, the ratio is $\frac{1}{2}$ with $2^1 = 0$ and $2^0 = 1$. For both switches S1 and S2 open, the $e/V$ ratio is $\frac{1}{4}$ with $2^1 = 1$ and $2^0 = 1$. These considerations lead to the following equations:

$$RI = 3RI;$$

$$RI = R2; \text{ and}$$

$$3RI = R1 + R2.$$

The above equations are found to be inconsistent so a new approach is required.

Since the ADC converts an analog signal into one of several discrete values, there is a range of input voltages — and consequently, $e/V$ ratios — that produce the same output binary value. Since the ADC can be made to do so, the binary value associated with $e/V = \frac{3}{4}$ will also be produced whenever $e/V$ between the values of $\frac{5}{8}$ and $\frac{7}{8}$. Similarly, the binary output values for $e/V = \frac{1}{2}$ are produced for values of $e/V$ between $\frac{3}{8}$ and $\frac{5}{8}$, and those for $e/V = \frac{1}{4}$, between $\frac{1}{8}$ and $\frac{3}{8}$.

This leads to the following set of inequalities:

$$21R1 \geq 3RI \geq 5R1;$$

$$25R2 \geq 15RI \geq 9R2; \text{ and}$$

$$3R1 + 3R2 \geq 5RI.$$

This set of inequalities can be solved in many way, one way being linear programming which requires a function that can be maximized or minimized. Maximizing $Z = R1 + R2$ leads to a ratio of $R1:R2:RI$ of 9:25:15. The resulting $e/V$ ratios are:

S1 open — $e/V = 0.625$;

S2 open — $e/V = 0.375$; and

S1 & S2 open — $e/V = 0.306$.

The limits of the ADC can be adjusted to have thresholds between the above values. That is, for a binary output of $2^1 = 2^0 = 0$, the ratio of $e/V$ should be greater than 0.8125; for $2^1 = 1$ and $2^0 = 0$, the $e/V$ ratio should be between 0.8125 and 0.5; for $2^1 = 0$ and $2^0 = 1$, between 0.5 and 0.3405; and for $2^1 = 2^0 = 1$, between 0.3405 and 0. By making the lower limit of the $e/V$ ratio 0.153 instead of zero, an advantage is gained which is described in more detail below.

FIG. 2 is an illustration of a two switch circuit. Four voltage comparators 20–23, such as high input impedance, high gain operational amplifiers without feedback, compare a reference voltage to the input voltage, $e$, from the switch line. The reference voltages are taken from a chain of resistors $R_A$–$R_E$. Neglecting the high input impedance of the comparators 20–23, the values of resistors useful in the circuit according to the criteria discussed above are:

$R1 = 900\Omega$
$R2 = 2500\Omega$
$RI = 1500\Omega$
$RA = 3750\Omega$
$RB = 6250\Omega$
$RC = 3190\Omega$
$RD = 3750\Omega$
$RE = 3060\Omega$ The table of FIG. 3 summarizes the operation of the circuit shown in FIG. 2. The first two columns show the conditions of the switches S1 and S2. A 0 entry indicates the switch is in the normally closed position and a 1 entry, that the switch is operated to the open position. The third column shows the resulting $e/V$ ratio. The fourth through seventh columns indicate the output signals from the comparators; a 0 entry indicates a low or logical zero value and a 1 entry indicates a high or logical 1 value. The eighth and ninth columns indicate the logical (binary) output signals from two NAND gates 24 and 25 (FIG. 2), respectively.

The polarity (0 or 1) of the output signal from the comparators 20–24 depends on the values of the voltages at the inverting (−) and non-inverting (+) input nodes. When the voltage at the non-inverting input node is greater than the inverting input voltage, the comparator output is high (1). Otherwise, it is low (0).

In the explanation which follows, first the $2^0$ and $2^1$ outputs for different switch positions will be discussed. Elements 23 and 27 form a circuit for detecting an open in the series input circuit which includes R1 and R2 (which could result, for example, from a cut wire in a burglar alarm system). The circuit which includes comparator 29 is for detecting a greater than normal voltage across the series input circuit. These auxiliary circuits are discussed later.

When neither switch S1 nor S2 is open (first row of the table of FIG. 3), the value of $e$ is equal to V, i.e., $e/V = 1$. The non-inverting input voltage to the comparator 20 is 0.8125 V and the inverting input voltage is V. Therefore, the output signal from the comparator 20 (C1) is low (0). The output signals from the other comparators are high (1) because the non-inverting input voltage is greater than the inverting input voltage. The logical one output signal from the comparator 21 is inverted to a logical zero by a NAND gate inverter 24. Thus, the $2^0$ binary value is zero. The output signal from a NAND gate 26 is high (logical 1) because of the logical zero input signal from the comparator 20. Both input signals to a NAND gate 25 are high which produces a low output signal. Therefore, the binary value of $2^1$ is zero.

When switch S1 is operated to the open position, the voltage $e$ is 0.625V which is lower than the value 0.8125V non-inverting input voltage to comparator 20 and greater than the inverting input voltage of the other comparators 21–23. Therefore, the output signals from all the comparators 20–23 are logical ones. The $2^0$ binary output signal remains at zero because it is the inverted output signal from the comparator 21. The output signal from the NAND gate 26 is low because both input signals are high, which causes the output signal from the NAND gate 25 to be a logical 1. Therefore, the binary value of $2^1$ is 1.

When the switch S2 is opened (with S1 closed), the value of e is 0.375V. This is lower than the 0.8125V reference voltage on the comparator 20 and the 0.5V reference voltage on the comparator 21. It is greater than the 0.3405V and 0.153V reference voltages on the comparators 22 and 23, respectively. The output signals from the comparators are shown in row three of the table of FIG. 3. The logical zero output signal from the comparator 21 inhibits the NAND gate 26 and is inverted into the $2^0$ binary value by the NAND gate 24. The high output signals from the comparator 22 and the NAND gate 26 produce a low output signal from the NAND gate 25 so that $2^1$ is zero.

Opening both switches produces a value of e equal to 0.306V which is lower than the reference voltages to the comparators 21-23. The resulting zero output signal from the comparator 21 is inverted to a logical one by the NAND gate 24. The NAND gate 25 is inhibited by the zero output signal from the comparator 22. Therefore, the binary values are $2^1 = 2^0 = 1$.

As the number of switches increases, the values of the series impedances become more critical. This problem can be avoided if the termination impedance, RI, is replaced with a constant current source as shown in the circuit of FIG. 4. A simple constant current source can be constructed using a transistor 40 and a zener diode 41. As is well known in the art, the current, I, supplied is approximately $(V_z - V_{BE})/RE$, where $V_z$ is the zener voltage of the diode 41 and $V_{BE}$ is the potential drop between the emitter and base of the transistor 40. RE is the emitter resistor and $R_z$ the zener load resistor.

The values of the resistors are linearly related to the value of e when using a constant current source (neglecting the input impedance of the analog-to-digital converter). If $R1 = 0.25V/I$ and $R2 = 0.50V/I$, then $R1 = R2 = 0.75V/I$, where V is the input voltage and I is the current supplied by the constant current source. Thus, it follows that for n switches, the series resistor values can be found by $$R_i = 2^{i-1}V/2^nI, \text{ or}$$

$$R_i = 2^{i-n-1}(V/I).$$

The binary output line from the ADC representing the least significant bit corresponds to switch S1. The next higher significant bit corresponds to switch S2, and so on, the most significant binary output line corresponding to switch $S_n$.

When the switch wire is open, the value of e drops to ground, causing the output signal from the comparator 23 (FIG. 2) to be low which can be inverted to a logical one by a NAND gate 22 to produce a special Z signal to indicate a malfunction or the operation of a special switch opening the line. If the switch line is part of a burglar alarm, then the Z signal will occur if the wire is cut.

The above description is based on the switches being normally closed. The same principles apply, however, to an arrangement using normally-open switches. The output binary values can be inverted to maintain correlation of switches to binary values.

The principle of detection of remote multiple switch activation can be extended to n switches. The number of combinations of switches that can be operated simultaneously is $2^n$.

An additional advantage of the circuit according to the invention is that a break or open circuit in the line can be detected. Where the switches represent entry detectors in a burglar alarm system, the attempt to inactivate the alarm by cutting the wire will produce an input voltage to the ADC that can be distinguished from the binary values indicating the switches. For example, in FIG. 2 the opening of the line produces a ground potential at the non-inverting input terminal of the comparator 23. Because this is lower than the potential at the junction of resistors $R_D$ and $R_e$, the output signal of the comparator 23 is a logical zero which is inverted to a logical 1 by an inverter 27.

An attempt to bypass a burglar alarm using the circuit of FIG. 2 by coupling a voltage to the line that is higher than a voltage which would indicate a switch had been operated can be detected by tapping a potential off the resistor $R_A$ to the inverting input terminal of a comparator 29. The switch line potential is applied to the non-inverting input terminal via the voltage divider comprising two resistors $R_F$ and $R_G$. The voltage divider $R_F$ and $R_G$ have a ratio to the potential at the tap of $R_A$ so that the application of a potential greater than V will cause the output signal of the comparator 29 to be a logical 1.

In FIG. 5, a burglar alarm system according to the invention is illustrated, showing a switch S1 which is coupled to be operated, i.e., opened, when a window 51 is opened. A switch S2 is similarly operated when a door 52 is opened. A single wire conductor 56a, 56b and 56c couples the switches in series between a voltage potential, +V, and a detector 54. A resistor R1 is coupled in parallel across switch S1 and a resistor R2 is coupled in parallel across switch S2.

The detector 54 comprises a termination impedance and an analog-to-digital converter as described above. When any of the previously-described signals are generated, i.e., $2^1$, $2^0$, Z and Q (all in FIG. 2), an alarm 53 is activated. Therefore, if any access way is opened, if the connector wire 56a-56c is cut, or if a voltage potential greater than +V is applied to the series circuit, the alarm 53 will be activated.

Although illustrated with only two switches, the burglar alarm system can be used with a large number of switches through still requiring only a single wire to connect them into the alarm circuit.

If the $2^0$ and $2^1$ signals (FIG. 2), corresponding to the door and window switches, respectively, are coupled to the alarm via switches 61 and 62 as shown in FIG. 6, then the alarm can be selectively disabled for one of the accesses if desired.

The invention is described as operating with fixed, direct current voltages and resistors, but it is understood that variable, alternating-current voltages with other types of impedances, e.g., capacitors and inductors, can be used.

What is claimed is:
1. The combination comprising:
first and second reference voltage source means for supplying first and second reference voltage levels;
termination impedance means having first and second terminal means, said second terminal means coupled to said second reference voltage source means, for providing termination impedance;
a plurality of impedance means coupled in series between said first reference voltage source means and the first terminal means of said termination impe- dance means for causing a voltage drop across said termination impedance means;

a plurality of selectively operable switching means, each coupled across a separate one of said plurality of impedance means for selectively bypassing individual ones of said plurality of impedance means; and analog-to-digital converter means coupled across said termination impedance means for supplying digital signals representative of the voltage drop across said termination impedance means.

2. The invention as claimed in claim 1 further including means coupled to the junction of said termination impedance means and said plurality of impedance means for producing a signal indicative of a potential level at said second reference voltage level.

3. The invention as claimed in claim 1 further including means coupled to the junction of said termination impedance means and said plurality of impedance means for producing a signal indicative of a potential level exceeding said first reference voltage level.

4. The invention as claimed in claim 3 wherein said impedance means are resistors.

5. In combination:

a plurality N of impedances connected in series between first and second terminals;

a further impedance connected between the second of said terminals and a point of reference potential;

means for applying an operating voltage to the first of said terminals;

the values of the respective impedances being chosen to provide at said second terminal, a unique voltage for each of a plurality of combinations of switch means conditions, that is, opened or closed; and means responsive to the voltage at said second terminal for translating the same to a binary signal.

6. The invention as claimed in claim 5 wherein said impedance means comprise resistors.

7. A burglar alarm system for an enclosed area having a plurality of access means comprising, in combination:

a plurality of switch means, each operated by a separate one of said plurality of access means, for assuming one condition when the associated access means prevents entry into the enclosed area and assuming another condition when the associated access means permits entry into the enclosed area;

a plurality of impedance means, each coupled in parallel across a separate one of said plurality of switches;

single conductor means for connecting said plurality of switches in a series circuit;

means for applying a signal at one end of said series circuit; and detector means coupled to the other end of said series circuit for detecting the condition of each of said plurality of switches.

8. The invention as claimed in claim 7 wherein said signal is a voltage level and said detecting means includes a termination impedance and analog-to-digital converter means.

9. The invention as claimed in claim 8 wherein said detecting means includes means for selectively disabling the detection of the condition of each of said plurality of switches.

10. The invention as claimed in claim 8 including means for detecting an open circuit in said single conductor means.

* * * * *